United States Patent
Melik-Martirosian et al.

(10) Patent No.: US 7,462,907 B1
(45) Date of Patent: Dec. 9, 2008

(54) METHOD OF INCREASING ERASE SPEED IN MEMORY ARRAYS

(75) Inventors: Ashot Melik-Martirosian, Sunnyvale, CA (US); Timothy Thurgate, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 197 days.

(21) Appl. No.: 11/268,025

(22) Filed: Nov. 7, 2005

(51) Int. Cl.
*H01L 21/00* (2006.01)

(52) U.S. Cl. .................. 257/321; 257/314; 257/510

(58) Field of Classification Search .......... 257/314, 257/390, 321, 510
See application file for complete search history.

(56) References Cited

U.S. PATENT DOCUMENTS

| | | | |
|---|---|---|---|
| 5,408,431 A * | 4/1995 | Challa | 365/185.17 |
| 6,465,375 B1 * | 10/2002 | Ahn et al. | 438/800 |
| 6,809,386 B2 * | 10/2004 | Chaine et al. | 257/368 |
| 6,855,608 B1 * | 2/2005 | Ramsbey et al. | 438/287 |
| 6,912,163 B2 * | 6/2005 | Zheng et al. | 365/185.29 |
| 7,151,292 B1 * | 12/2006 | Wong | 257/314 |
| 7,180,125 B2 * | 2/2007 | Wang | 257/315 |
| 7,206,224 B1 * | 4/2007 | Randolph et al. | 365/185.03 |
| 7,283,402 B2 * | 10/2007 | Randolph et al. | 365/185.29 |
| 7,292,478 B2 * | 11/2007 | Yu et al. | 365/185.28 |
| 2003/0151948 A1 * | 8/2003 | Bhattacharyya | 365/185.18 |
| 2004/0136240 A1 * | 7/2004 | Zheng et al. | 365/185.29 |
| 2005/0012141 A1 * | 1/2005 | Bhattacharyya | 257/318 |
| 2005/0077567 A1 * | 4/2005 | Randolph et al. | 257/315 |
| 2005/0245028 A1 * | 11/2005 | Lee | 438/257 |
| 2006/0067125 A1 * | 3/2006 | Lue | 365/185.18 |
| 2006/0118858 A1 * | 6/2006 | Jeon et al. | 257/321 |
| 2007/0012988 A1 * | 1/2007 | Bhattacharyya | 257/314 |
| 2007/0045707 A1 * | 3/2007 | Wang | 257/314 |
| 2007/0063268 A1 * | 3/2007 | Yu et al. | 257/330 |
| 2007/0115730 A1 * | 5/2007 | Randolph et al. | 365/185.29 |
| 2008/0157263 A1 * | 7/2008 | Melik-Martirosian | 257/510 |

\* cited by examiner

*Primary Examiner*—Laura M Menz
(74) *Attorney, Agent, or Firm*—Renner, Otto, Boisselle & Sklar, LLP

(57) ABSTRACT

A memory array and a method of increasing erase speed therein are provided. The memory array includes a plurality of memory devices organized in rows and columns, where a plurality of bitlines are oriented substantially parallel to one another along a first direction and a plurality of wordlines are oriented substantially parallel to one another along a second direction perpendicular to the first direction. Each memory device includes a pair of energy barriers within the substrate on opposite sides of the channel width. The energy barriers prevent hot holes from diffusing out from under the gate, thereby increasing erase speed.

10 Claims, 3 Drawing Sheets

METHOD OF INCREASING ERASE SPEED IN MEMORY ARRAYS

TECHNICAL FIELD

The present invention relates generally to the field of nonvolatile memory devices and, more particularly, to a method of increasing erase speed in multiple-bit charge trapping dielectric flash electrically erasable and programmable memory devices.

BACKGROUND

A pervasive trend in modern integrated circuit manufacture is to downscale memory devices so as to increase the amount of data stored per unit area on an integrated circuit memory device, such as a flash memory device. Memory devices often include a relatively large number of core memory devices (sometimes referred to as core memory cells). For instance, a conventional dual-cell memory device, such as a charge trapping dielectric flash memory device, is capable of storing two bits (of data in a double-bit arrangement. That is, one bit can be stored using a first charge storing region on a first side of the memory device and a second bit can be stored using a second charge storing region on a second side of the memory device.

As shown in FIG. 1 and FIG. 2, a memory array can include a plurality of memory devices 10 organized in rows and columns, where a plurality of bitlines BL are oriented substantially parallel to one another along a first direction, and a plurality of wordlines WL are oriented substantially parallel to one another along a second direction that is perpendicular to the first direction. In such a configuration, a memory device 10 includes a pair of buried bitlines BL disposed within a semiconductor substrate 14. A charge trapping dielectric stack 16, which typically includes a non-conductive charge trapping layer 18 disposed between a bottom dielectric layer 20 and a top dielectric layer 22, is disposed over the semiconductor substrate 14. The charge trapping layer 18 typically includes a pair of charged storing regions on opposite sides of the layer between the buried bitlines BL. Over the top dielectric layer 22 is a wordline WL (also referred to as a gate electrode). In such a virtual ground architecture, the buried bitlines function as a source and a drain with an active channel region defined therebetween. Each memory device can be programmed, read, and erased by applying appropriate voltages to the source, drain, and wordline.

Where possible, it is desirable to downscale such memory devices, while still maintaining desirable qualities such as adequate data retention, and optimizing performance. However, memory device downscaling can result in a number of performance degrading effects. For example, at given width-pitch, as the width of the memory device is downscaled, the erase speed (e.g. the band-to-band (BTB) hot hole erase speed) can slow down considerably.

As shown in FIG. 2, one reason for this slow down is that BTB hot holes 30 generated in the vicinity of the bitline-to-substrate junction are capable of diffusing an appreciable distance away from the location of generation, both in the vertical direction and in the lateral direction (i.e., in the direction perpendicular to the cell channel). The probability of hole injection into the charge trapping layer is a function of the angle (A) and the magnitude of the hole velocity. If such BTB hot holes diffuse far enough so that they are no longer under the cell gate (wordline), they will have a very low probability of being injected into the charge trapping layer 18 under the gate (wordline), and, therefore, will not contribute to erasing the memory cell.

In view of the foregoing, there is a need for improved memory devices, such as charge trapping dielectric flash memory devices, which optimize scale and performance.

SUMMARY OF THE INVENTION

According to one aspect of the invention, the invention is directed to a charge trapping dielectric memory device including a semiconductor substrate, a pair of bitlines disposed within the semiconductor substrate, and a charge trapping dielectric stack disposed over the semiconductor substrate. A wordline is disposed over the charge trapping dielectric stack, and the wordline electrically defines a channel within a portion of the semiconductor substrate, the channel having a length dimension along a direction between the bitlines and a width dimension along a direction perpendicular to the length dimension. The memory device includes a pair of energy barriers disposed at least partially within the substrate on opposite sides of the channel along the width dimension.

According to another aspect of the invention, the invention is directed to a method of increasing erase speed in an array of charge trapping dielectric memory devices. The array of memory devices includes bitlines and wordlines arranged in rows and columns, the wordlines electrically defining channels within a substrate, and the channels extending between adjacent bitlines. The method includes forming an energy well adjacent the channel of one or more memory devices.

According to another aspect of the invention, the invention is directed to a memory device having a semiconductor substrate, a pair of bitlines disposed within the semiconductor substrate, a charge trapping dielectric stack disposed over the semiconductor substrate, and a wordline disposed over the charge trapping dielectric stack. The wordline electrically defines a channel within a portion of the semiconductor substrate, the channel having a length dimension along a direction between the bitlines and a width dimension along a direction perpendicular to the length dimension. A method of increasing erase speed in the device includes forming a pair of energy barriers at least partially within the substrate on opposite sides of the channel along a channel width dimension.

According to another aspect of the invention, the invention is directed to a method of increasing erase speed in a charge trapping dielectric memory device having an electrically defined channel within a substrate of the device. The method includes laterally confining a plurality of generated hot holes within the channel.

BRIEF DESCRIPTION OF DRAWINGS

These and further features of the present invention will be apparent with reference to the following description and drawings, wherein.

DISCLOSURE OF INVENTION

Figure 1:
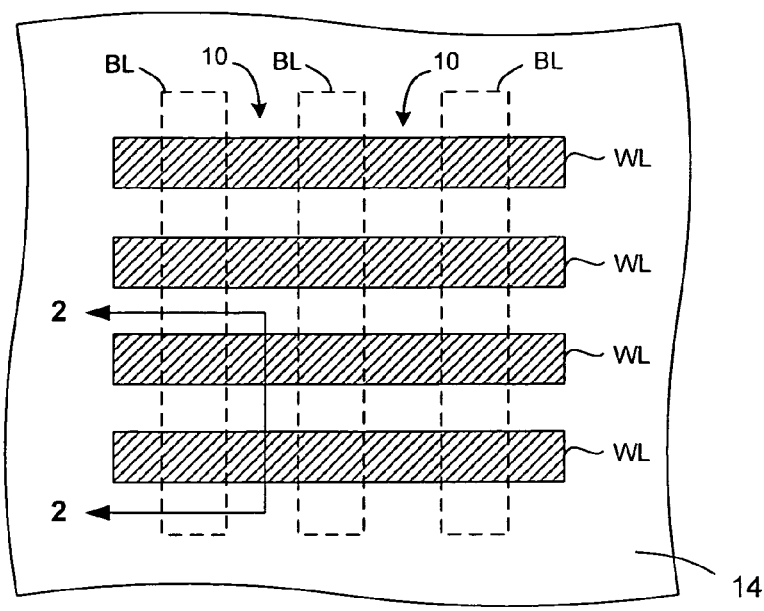
FIG. 1 is a top plan view of a portion of a conventional memory array.

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

Generally, aspects of the present invention relate to a memory array having increased erase speed and/or a memory array that can be downscaled without an appreciable loss of erase speed. As is described more fully below, the memory array can include a plurality of memory devices that each include energy barriers laterally adjacent to the device channel region. The energy barriers confine band-to-band-generated hot holes under the gate region of the substrate (channel), thereby increasing the number of hot holes available for erase, which increases the erase speed.

Figure 2:
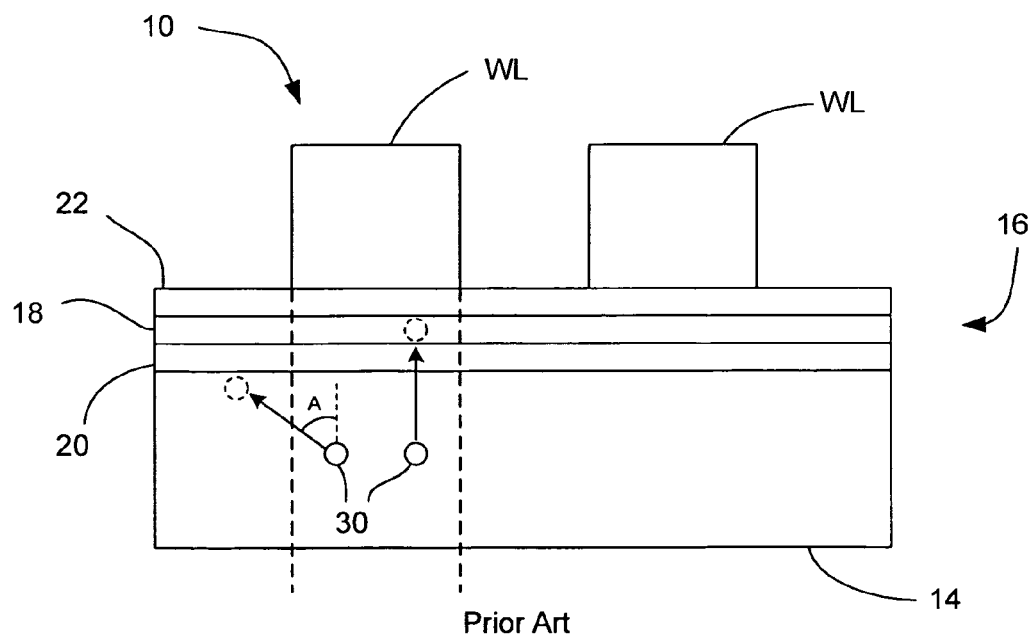
FIG. 2 is a sectional view of the memory array taken along line 2-2 showing hole leakage from under the gate.
Figure 3:
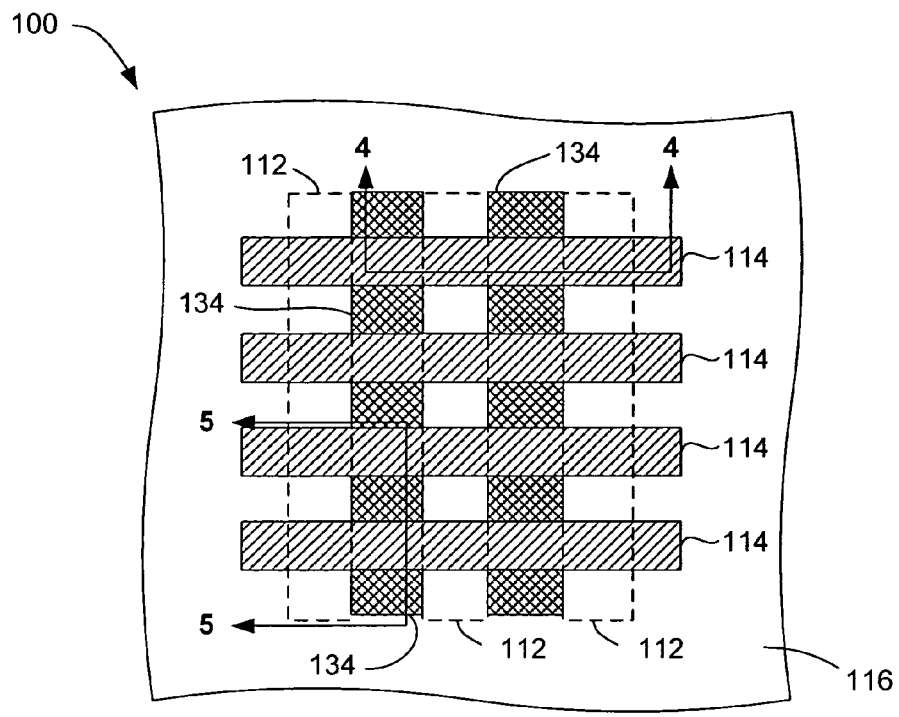
FIG. 3 is a top plan view of a portion of a memory array in accordance with the present invention.
Figure 4:
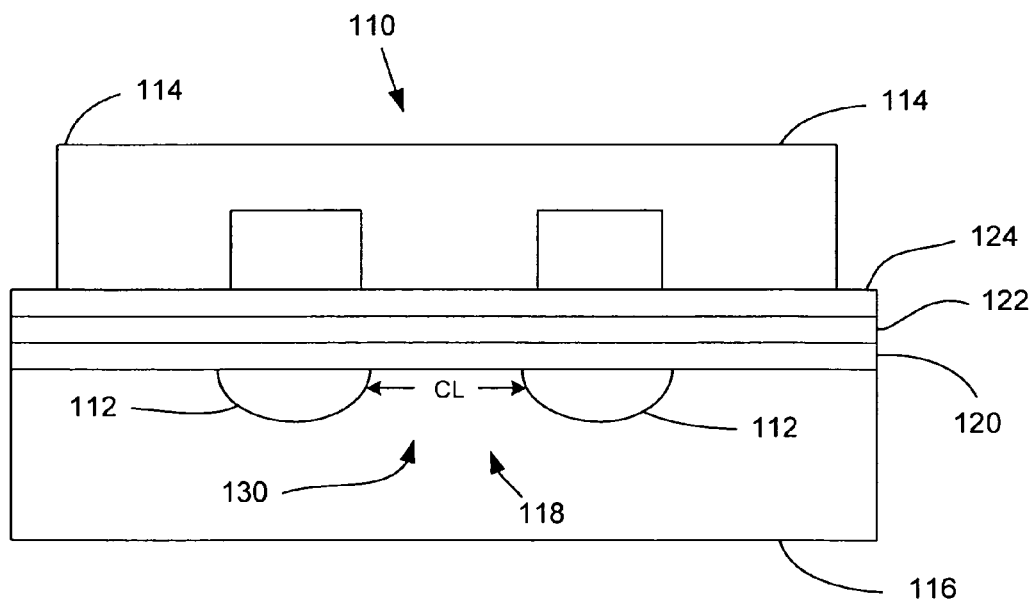
FIG. 4 is a section view of the memory array taken along line 4-4.

Referring to the drawings wherein like reference numerals designate like parts in the several figures, and initially to FIGS. 2-4, an exemplary array of multiple-bit charge trapping dielectric, non-volatile, electrically erasable and programmable memory devices generally is illustrated at 100. The array 100 can include a plurality of memory devices 110 organized in rows and columns, where a plurality of bitlines 112 are oriented substantially parallel to one another along a first direction, and a plurality of wordlines 114 are oriented substantially parallel to one another and perpendicular to the bitlines 112.

Each memory device 110 includes a semiconductor substrate 116. In one embodiment, the substrate 116 initially can be doped to have P-type conductivity (e.g., P dopant concentration). A pair of buried bitlines 112 can be formed within the substrate 116. The bitlines 112 can be formed of a number of suitable materials. For example, each bitline 112 can be doped to have an N-type conductivity (e.g., $N^+$ dopant concentration). In one embodiment (e.g., in a virtual ground architecture), each buried bitline 112 functions as a source and a drain respectively, during various programming, reading, and erasing operations. While the present invention is being discussed in connection with buried bitlines, it is to be appreciated that other bitline configurations may be employed without departing from the scope of the present invention.

A body 118 is formed between the source and the drain. The body 118 can have the same dopant type and concentration as the initial dopant of the substrate 116. As is described more fully below, the substrate 116, a portion of the source, a portion of the drain and body can be formed, for example, from a semiconductor, such as appropriately doped silicon, germanium or silicone-germanium.

Above the body 118 is a first dielectric layer 120 (sometimes referred to as a tunneling dielectric layer or a bottom dielectric layer) that is made from, for example, silicon oxide (e.g., $SiO_2$), other standard-K material (e.g., material having a relative permittivity below ten) or a high-K material (e.g., material having a relative permittivity, in one embodiment above ten and, in another embodiment, above twenty).

Over the bottom dielectric layer 120 is a charge trapping layer 122 (also referred to as a charge storing layer). The charge trapping layer 122 can be made from, for example, a non-conductive material, including silicon nitride (e.g., $Si_3N_4$), silicon oxide with buried polysilicon islands, implanted oxide and the like.

Over the charge trapping layer 122 is another dielectric layer 124 (also referred to as a top dielectric layer) made from a material, such as, for example, silicon oxide, other standard-K material or a high-K material. The first dielectric layer 120, the charge trapping layer 122, and the second dielectric layer 124 can be referred to as a dielectric stack or a charge trapping dielectric stack. It is to be appreciated that the dielectric stack can include greater than or fewer than three dielectric or non-conductive layers without departing from the scope of the present invention.

Over the second dielectric layer 124 is a gate electrode 114 (also referred to as a gate or as a wordline). The wordline 114 can be made from, for example, polycrystalline silicon (also referred to simply as poly) or another appropriate material, such as a metal or metal oxide. A work function of the wordline 114 controls a channel 130 (e.g., inversion or depletion states) within the body. Optionally, sidewall spacers (not shown) can be disposed adjacent lateral sidewalls of the wordline and the charge trapping dielectric stack for use in controlling dopant implantation, device properties, and the like.

Generally speaking, the channel 130 for each memory device runs within the substrate between the respective bitlines 112 and under the width of the wordline 114. That is, in addition to a depth dimension (extending into the substrate below the charge trapping dielectric stack), the channel 130 has a pair of lateral dimensions: a channel length CL between the bitlines 112, and a channel width CW that is approximately the same as the width of the wordline 114, which work function controls the channel.

Figure 5:
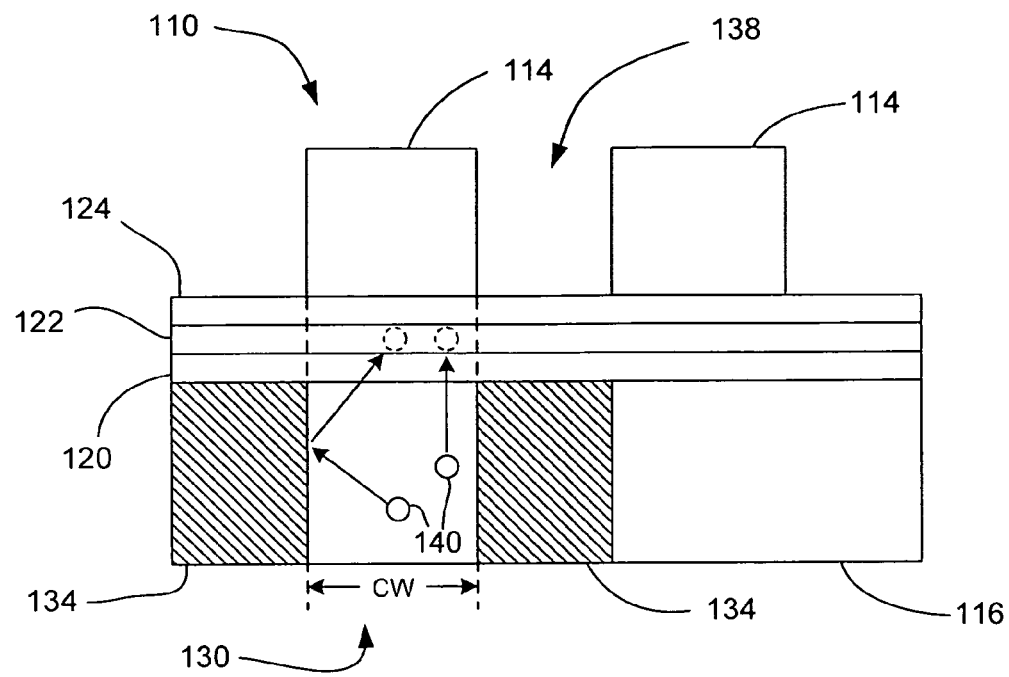
FIG. 5 is a section view of the memory array taken along line 5-5.

As shown in FIG. 5, the memory device 110 includes a pair of energy barriers 134. The energy barriers 134 are disposed within the substrate 116 laterally adjacent the channel 130 (e.g., on opposite sides of the channel 130 along the channel width CW dimension).

The energy barriers 134 are made or otherwise comprised of a material having a sufficiently large valence band offset with respect to the silicon valence band (or the valence band of the material of which the substrate is made). In one embodiment, the energy barriers 134 are comprised of a material having at least about a 4.9 eV (electron-Volt) valence band offset with respect to the silicon valence band. The energy barriers 134 can be made from a number of suitable materials, including, but not limited to, silicon oxide (e.g., $SiO_2$) and high-K materials having a sufficiently large enough valence band offset with respect to the valence band of the substrate material (e.g., materials having a valence band offset of at least about 4.9 eV with respect to the substrate material).

In one embodiment, each energy barrier has a lateral dimension or length that is approximately equal to the device channel length CL and a width that is approximately equal to width of the wordline gap 138 (e.g., the gap between adjacent wordlines). Each energy barrier 134 as a depth that is sufficient to confine the majority of holes 140 under the gate (e.g., a depth of about 0.20 microns to about 0.30 microns). Of course, the energy barriers can extend deeper or shallower into the substrate without departing from the scope of the present invention.

In the embodiment illustrated in FIG. 5, the energy barriers 134 are formed approximately only within the substrate 116 (e.g., in trenches within the substrate, and not extending upward outside of the substrate). In an alternative embodiment, illustrated in FIG. 6, the energy barriers 134 are formed within and extending above the substrate 116, thereby filling the gaps 138 between the wordlines 114.

Formation of energy barriers 134 on opposite sides of the channel 130 along its width dimension CW is effective to form an energy well that confines holes 140 under the gate within the channel 130. As is discussed more fully below, the formation of the energy barriers facilitates increased erase speed and/or greater wordline width scaling without degradation of erase speed Each memory device 110 within the array can be programmed using hot electron injection (also referred to as channel hot electron injection (CHE), in which charge can be injected and trapped or stored in first and second charge storing cells or regions within the charge trapping dielectric layer. For example, using hot electron injection, a first charge storing cell can be programmed by applying voltages to the one of the bitlines 112 (serving as a drain) and to the wordline 114. A second bitline functions as a source of electrons for the CHE programming of the first charge storing cell. A second charge storing cell can be programmed using a similar process, but the functions of the source and the drain are reversed.

In one embodiment, once one or both of the charge storing cells are programmed with stored charge, one or both of the charge storing cells can be erased using the technique of hot hole injection (sometimes referred to as band-to-band (BTB) hot hole injection). Hot hole injection involves applying appropriate voltage potentials to the wordline and the source and/or drain to erase one or both of the charge storing cells within the charge trapping layer.

In one exemplary embodiment, each charge storing cell (sometimes referred to as the normal bit and the complementary bit) of each memory device 110 can be erased simultaneously by applying a negative erase voltage (e.g., about −5 volts to about −7 volts) to the wordlines 114 and applying a positive bias voltage (e.g., about +4.5 volts to about +6 volts) to both bitlines 112 (the bitlines functioning as a source and drain in the virtual ground architecture).

Alternatively, in the so-called single-sided erase implementation, all of the bits adjacent to even-numbered bitlines can be erased simultaneously by applying a negative erase voltage to the wordlines 114, applying a positive bias voltage only to even-numbered bitlines 112, while floating the odd-numbered bitlines. Erase of the bits adjacent to odd-numbered bitlines is then performed by repeating the above single-sided erase operation with even- and odd-numbered bitlines' biases interchanged.

Application of these potentials creates a BTB tunnel current under the gate. Holes are generated under these conditions and accelerated from the drain region into the body 118 (and channel 130 within the body 118). The generated holes are accelerated in the electric field created near the drain/body junction. Some of the accelerated holes surmount the bottom-dielectric-to-silicon interface between the substrate 116 and the bottom dielectric layer 120 and are injected into the charge trapping layer 122 to displace electrons (e.g., by recombination), thereby erasing the cell.

As noted above in connection with FIG. 2, it has been observed that BTB-hot-hole erase speed slows down considerably in conventional multi-bit memory devices, as the devices are scaled. One reason for this slow-down is due to the fact that hot BTB holes, generated in the vicinity of the bitline-to-substrate junction, are capable of diffusing an appreciable distance away from the location of generation, both in the vertical and in the lateral (perpendicular to cell channel) direction, as shown in FIG. 2. If such BTB hot holes diffuse far enough, so that they are not under the cell gate (wordline) anymore, they will have a very low probability of getting injected into the charge trapping layer under the gate (wordline), and, therefore, will not contribute to the erase the memory cell.

This is the case because, in order to diffuse far, such holes, at the instance of their generation, need to be moving in the direction substantially different from vertical up (see FIG. 2, for example), and the probability of injection into the charge-trapping layer is a very strong function of the angle (A in FIG. 2) and the magnitude of the hole velocity, so that at the same energy/velocity, a hole traveling substantially vertically has much higher probability of injection into the charge-trapping layer than a hole traveling at an angle A.

In addition to injection of energetic primary-generated BTB hot holes, erase of the memory cell can occur because the primary-generated hot holes are able to impact-ionize and create secondary hot holes, which also can be injected into the charge-trapping layer under the gate of the device. However, if a primary hole diffuses away from under the gate and creates a secondary hot hole away from under the gate, the probability of the injection for such a secondary hot hole is also very low. Thus, BTB-generated hot holes, both primary and secondary, which are generated or diffuse away from the gate are lost for the purposes of the erase operation.

Figure 6:
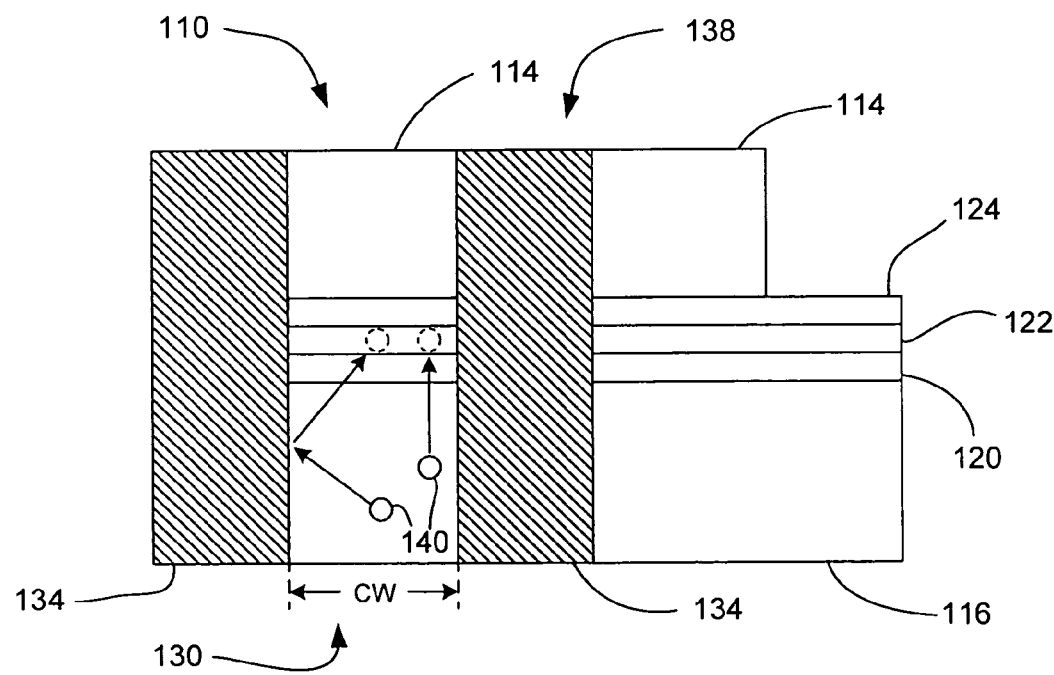
FIG. 6 is a section view of the memory array taken along line 5-5 according to an alternative embodiment of the present invention.

As shown in FIGS. 5 and 6, the memory device described herein includes a pair of energy barriers 134 disposed on opposite sides of the channel width CW. In this configuration, hot holes 140 diffusing in the lateral direction will encounter an energy barrier-substrate valence band energy barrier, which will prevent hot holes 140 with energies less than the height of the barrier from escaping from under the gate. Some of these barrier-incident holes will be elastically reflected back into the under-the-gate region, where they can contribute to the erase—either directly, through injection into the charge trapping layer, or through further impact-ionization and creation of secondary hot holes.

Therefore, by forming energy barriers on the sides of the gate, and by confining the BTB-generated hot holes under the gate region of the substrate, the total number of hot holes available for the erase operation is increased, thereby increasing the overall speed of the erase operation. This methodology facilitates additional wordline (gate) width scaling at a given wordline pitch without undesirable erase speed degradation.

In an exemplary embodiment, the formation of energy barriers is believed to increase erase speed by a factor about at least two. Stated differently, erase speed can be maintained for a wordline width scaling of a factor of about at least two.

While, for purposes of simplicity of explanation, the exemplary manufacturing description provided below is described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect of the invention. Furthermore, additional steps can be added to the fabrication techniques described herein.

As indicated, a semiconductor substrate 116 is provided. The semiconductor substrate 116 can be initially doped with P-type dopant, such as by implanting boron ions, gallium ions or indium ions. As indicated above, the initial substrate doping can provide the desired conductivity for a central portion of the body. In one embodiment, the initial substrate doping can have a "P" concentration, a "P+" concentration or a "P−" concentration. A layer of material used to form the first or bottom dielectric layer 120 can be grown or deposited on top of the substrate 110. It is noted that the bottom dielectric layer can optionally be used as an implant screen during the implantation of dopant species into the substrate 110. In this instance, the bottom dielectric layer can be formed before initial substrate implantation.

As indicated above, the bottom dielectric layer 120 can be formed from an appropriate dielectric material, such as a thermal oxide layer made from silicon oxide (e.g., $SiO_2$), or a high-K material. High-K materials are materials having, in one embodiment, a relative permittivity of ten or higher and, in another embodiment, of twenty or higher. Although other high-K materials can be selected, hafnium oxide (e.g., $HfO_2$), zirconium (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$), and barium strontium titanate (e.g., BST) are suitable high-K materials. In addition, all binary and ternary metal oxides and ferroelectric materials having a K higher than, in one embodiment, about twenty can be used for the bottom dielectric layer 120. The bottom dielectric layer can have a final thickness of, for example, about 40 angstroms to about 400 angstroms, depending upon the material used.

Following formation of the bottom dielectric layer 120, a layer of material used to form the charge trapping layer 122 can be formed on or over the bottom dielectric layer 116. In one embodiment, the charge trapping layer 122 can be formed from silicon nitride (e.g., $Si_3N_4$). Other suitable dielectric materials may also be used to form the charge trapping layer 122. In one exemplary embodiment, the charge trapping layer 122 can have a final thickness of about 20 angstroms to about 100 angstroms.

On top of or over the charge trapping layer, a second or top dielectric layer 124 can be formed. Similar to the bottom dielectric material layer, the top dielectric material layer can be made from an appropriate dielectric, such as silicon oxide or a high-K material. The top dielectric layer can have a thickness of about 20 angstroms to about 150 angstroms.

On top of over the top dielectric layer 124, a wordline layer 114 can be formed. The wordline layer 114 can be made from, for example, polycrystalline silicon (poly) or another appropriate material, such as a metal or metal oxide. In one embodiment, the wordline 114 can have a thickness of, for example, about 500 angstroms to about 3000 angstroms.

The bottom dielectric layer 120, the charge trapping layer 122, the top dielectric layer 124 and the wordline layer 114 can be uniformly formed across the substrate 116 in an area used to form a core array of memory devices.

After the layers 120, 122, 124, and 114 have been formed, these layers can be patterned to form stacked gates. The patterning step can also be referred to as a bitline mask and etch step. A mask layer can be formed from, for example, a photoresist that is patterned using photolithographic techniques. The mask layer can be patterned into a series of lines and spaces where the lines cover the layers 120, 122, 124, and 114, where the stack gates are formed, and the spaces expose the layers 120, 122, 124, and 114, where the bitlines 112 will be formed.

The layers 120, 122, 124, and 114 can be etched in areas left exposed by the mask layer to expose the substrate 116. In an alternative embodiment, the bottom dielectric layer 120 is left in place as an implant screen.

Once the patterning and/or etching process is complete, an ion or dopant implantation process is carried out to form the buried bitlines 112. In one embodiment, the buried bitlines are formed by the dopant implantation of an N-type dopant species (e.g., ions such as antimony, phosphorous or arsenic). It is to be appreciated that the stacked gate can function as a self-aligned mask for the dopant implantation.

Once the bitlines 112 are formed, the energy barriers 134 can be formed within the substrate 116. After providing a suitable mask layer over the bitlines 112, a plurality of trenches are formed within the substrate 116. The trenches can be formed to be a suitable depth depending upon the desired depth for the energy barriers. In an exemplary embodiment, the trenches have a depth of at least about 0.20 microns to about 0.30 microns. The trenches can be filled with a suitable material, such as silicon oxide (e.g., $SiO_2$) or a high-K material having a sufficiently large enough valence band offset with respect to the valence band of the substrate material (e.g., materials having a valence band offset of at least about 4.9 eV with respect to silicon). It is to be appreciated the energy barriers can be formed using a process similar to that used for the formation of shallow trench isolation (STI) features.

As should be apparent, the foregoing method can be modified as desired to form desired properties of the memory device. For instance, the order of steps can be modified, certain steps can be omitted and/or additional steps can be added. In addition, the specified materials, dopant parameters and so forth can be modified.

It should be noted that in interpreting the words "above", "over", and "on top of" in the specification and claims, these words are not intended to be restricted to directly above, directly over or directly on top of, but may include intervening layers between a layer described as being "above", "over", or "on top of" another layer or substrate. For example, the description of a first material above, over or on top of a substrate is not intended to exclude other layers being disposed therebetween.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A charge trapping dielectric memory device comprising:
   a semiconductor substrate;
   a pair of bitlines disposed within the semiconductor substrate;
   a charge trapping dielectric stack disposed over the semiconductor substrate;
   a wordline disposed over the charge trapping dielectric stack, the wordline electrically defining a channel within a portion of the semiconductor substrate, the channel having a length dimension along a direction between the bitlines and a width dimension along a direction perpendicular to the length dimension; and
   a pair of energy barriers disposed at least partially within the substrate on opposite sides of the channel along the width dimension.

2. The memory device of claim 1, wherein the energy barriers are comprised of a material having a valence band offset with respect to the valence band of the semiconductor substrate.

3. The memory device of claim 1, wherein the energy barriers are comprised of a material having a valence band offset of at least about 4.9 electron-Volts with respect to the valence band of the semiconductor substrate.

4. The memory device of claim 1, wherein the semiconductor substrate is comprised of silicon, and the energy barriers are comprised of a material having a valence band offset of at least about 4.9 electron-Volts with respect to the silicon valence band.

5. The memory device of claim 4, wherein the energy barriers are comprised of silicon oxide.

6. The memory device of claim 4, wherein the energy barriers are comprised of a high-K dielectric material.

7. The memory device of claim 1, wherein the energy barriers each have a length that is substantially the same as a length of the channel.

8. The memory device of claim 7, wherein the energy barriers have a width that is substantially the same as a width between adjacent wordlines.

9. A charge trapping dielectric memory device comprising:
a semiconductor substrate;
a pair of bitlines disposed within the semiconductor substrate;
a charge trapping dielectric stack disposed over the semiconductor substrate;
a wordline disposed over the charge trapping dielectric stack, the wordline electrically defining a channel within a portion of the semiconductor substrate, the channel having a length dimension along a direction between the bitlines and a width dimension along a direction perpendicular to the length dimension; and
a pair of energy barriers disposed at least partially within the substrate on opposite sides of the channel along the width dimension, wherein the energy barriers extend into the substrate at least about 0.20 microns to about 0.30 microns.

10. The memory device of claim 7, wherein the energy barriers have a height of at least about 0.20 microns to about 0.30 microns.

* * * * *